United States Patent
Tose et al.

(10) Patent No.: US 6,365,265 B1
(45) Date of Patent: *Apr. 2, 2002

(54) PHOTOSENSITIVE INSULATING PASTE AND THICK-FILM MULTI-LAYER CIRCUIT SUBSTRATE

(75) Inventors: Makoto Tose; Hiromichi Kawakami, both of Moriyama; Shizuharu Watanabe, Omihachiman; Michiaki Iha, Kusatsu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/476,759

(22) Filed: Jan. 3, 2000

(30) Foreign Application Priority Data

Jan. 27, 1999 (JP) .............................. 11-018703
Sep. 17, 1999 (JP) .............................. 11-263993

(51) Int. Cl.$^7$ ................................ B32B 3/00
(52) U.S. Cl. .................. 428/210; 428/325; 428/331; 501/20; 501/21; 501/65
(58) Field of Search ................... 428/323, 325, 428/331, 210; 501/20, 21, 65

(56) References Cited

U.S. PATENT DOCUMENTS

| | | | | |
|---|---|---|---|---|
| 5,766,741 A | * | 6/1998 | Kawakami et al. | ......... 428/210 |
| 5,968,858 A | * | 10/1999 | Kawakami et al. | ........... 501/14 |
| 6,183,669 B1 | * | 2/2001 | Kubota et al. | ........... 252/518.1 |
| 6,191,186 B1 | * | 2/2001 | Tose et al. | ................... 522/83 |

* cited by examiner

Primary Examiner—Cathy Lam
(74) Attorney, Agent, or Firm—Ostrolenk, Faber, Gerb & Soffen, LLP

(57) ABSTRACT

A photosensitive insulating paste including an insulating material containing a borosilicate glass powder. The insulating material is dispersed in a photosensitive organic vehicle, and the borosilicate glass powder contains $SiO_2$, $B_2O_3$ and $K_2O$ such that the compositional proportions by weight of the three components represented by ($SiO_2$, $B_2O_3$, $K_2O$) fall within a region formed by connecting points A (65, 35, 0), B (65, 25, 10), C (85, 5, 10) and D (85, 15, 0) in a ternary diagram thereof. A thick-film multi-layer circuit substrate including the paste is also disclosed.

18 Claims, 4 Drawing Sheets

PHOTOSENSITIVE INSULATING PASTE AND THICK-FILM MULTI-LAYER CIRCUIT SUBSTRATE

BACKGROUND OF THE INVENTION

1. Field of the Invention

The present invention relates to a photosensitive insulating paste suitable for forming an insulating layer in a high-frequency circuit, and to a thick-film multi-layer circuit substrate containing the paste.

2. Description of the Related Art

As high-frequency electronic apparatuses, including cellular phone terminals and computers, have come to have higher density and higher signal speed, insulating materials used in high-frequency circuits or like elements of the apparatuses are required to have lower dielectric constants. Insulating materials are primarily used for forming an insulating layer that separates two or more electrodes or transmission lines in, for example, a high-frequency circuit substrate or an electronic component for a high-frequency circuit.

Such an insulating layer often contains micro-pores, i.e., so-called via holes, for electrically connecting electrodes and circuits such as those formed of transmission lines, which are disposed on the upper and lower surfaces of the layer. The insulating layer containing via holes is formed through the following procedure, for example. An insulating paste is applied onto a substrate by way of printing at a predetermined position by means of a technique such as screen printing, and the paste is dried. Subsequently, via holes are formed in the paste and the paste is fired to thereby form the insulating layer.

Meanwhile, use of a photosensitive insulating paste is also known as a technique for forming pores serving as via holes in an insulating layer. The technique uses an insulating paste containing a photosensitive resin such as a photosensitive polyimide resin, and micro-pores for via holes are formed in the paste by means of photolithography.

For example, Japanese Patent Application Laid-Open (kokai) Nos. 110466/1997 and 50811/1996 disclose a technique for forming micro-via holes. According to the technique, a glass material containing $SiO_2$, $Al_2O_3$, $B_2O_3$, $Bi_2O_3$ and ZnO or a glass material containing $Bi_2O_3$, $SiO_2$, $B_2O_3$, BaO and ZnO is dispersed in a photocurable organic vehicle to thereby obtain a photosensitive insulating paste, the paste is applied onto a substrate and micro-via holes are formed by means of photolithography in electronic elements for forming circuits which require multi-layer wiring. Examples of insulating materials having low dielectric constants and used for forming the above-described insulating layer include an insulating material containing a powder having a low thermal expansion coefficient, such as cordierite.

However, among the above-described techniques, the technique making use of screen printing may cause some problems, such as bleeding due to the viscosity of an insulating paste and poor printing resolution attributable to a printing plate. Therefore, an insulating layer containing micro-via holes having a diameter of, for example, less than 150 μm is difficult to form, and thus, a circuit substrate and electronic components for constituting a circuit has not fully satisfied the demand for reduction in size and enhancement of density.

Meanwhile, the technique for forming an insulating layer through photolithography by use of a photosensitive insulating paste enables formation of micro-via holes having a diameter of, for example, less than 150 μm. However, the thus-obtained insulating layer has poor durability at high temperature and low plating resistance to an acidic plating solution.

Particularly, glass materials disclosed in Japanese Patent Application Laid-Open (kokai) Nos. 110466/1997 and 50811/1996 are difficult to form into an insulating layer having high reliability when an Ag-type conductive material is used for forming transmission lines or electrodes adjacent to an insulating layer formed of the glass materials since the Ag-type conductive material is highly reactive with the insulating layer and Ag may disperse into the insulating layer. In addition, the glass materials may react with the organic binder to effect ionic cross-linking. For example, even when a glass powder is stabilized by use of triazole or a like compound, the viscosity of the photosensitive insulating paste may decrease with passage of time and reliable patterns may fail to be formed.

Meanwhile, a thick-film multi-layer circuit substrate containing an insulating paste or a photosensitive insulating paste may have camber and distortion caused by a mismatch between the thermal expansion coefficient of an alumina substrate or the like and that of the insulating layer. Particularly when an insulating layer predominantly composed of cordierite, which has a low thermal expansion coefficient, is formed on an alumina substrate, the substrate may have considerable camber and distortion caused by a large difference between the thermal expansion coefficients.

Also, when conductive patterns are formed adjacent to an insulating layer, the conductive material generally has a high thermal expansion coefficient of at least 14 ppm/° C., resulting in a mismatch among the respective thermal expansion coefficients of the substrate material, the insulating layer, and the conductive patterns. In addition, depending on the circuit patterns, the produced circuit substrate may have considerable camber and distortion.

In view of the foregoing, there exists a demand for a photosensitive insulating paste which enables formation of micro-via holes, permits consistent film formation, and also permits arbitrary selection of thermal expansion coefficient.

Also, there exists a demand for a highly reliable thick-film multi-layer circuit substrate which has suppressed camber or distortion and which enables an increase in the density of conductive patterns.

SUMMARY OF THE INVENTION

Accordingly, in one aspect of the present invention, there is provided a photosensitive insulating paste comprising an insulating material containing a borosilicate glass powder, which material is dispersed in a photosensitive organic vehicle, wherein the borosilicate glass powder contains $SiO_2$, $B_2O_3$ and $K_2O$ such that the compositional proportions by weight of the three components represented by ($SiO_2$, $B_2O_3$, $K_2O$) fall within a region formed by connecting points A (65, 35, 0), B (65, 25, 10), C (85, 5, 10) and D (85, 15, 0) in the ternary diagram shown in FIG. 1.

Preferably, the borosilicate glass powder has the compositional proportions by weight of the three components represented by ($SiO_2$, $B_2O_3$, $K_2O$) falling within a region formed by connecting points E (75, 25, 0), F (75, 20, 5), G (85, 10, 5) and D (85, 15, 0) in the ternary diagram shown in FIG. 1.

Preferably, the insulating material contains the borosilicate glass powder in an amount of at least about 60 wt.%.

Preferably, the borosilicate glass powder has a mean particle size of about 0.1–5 μm.

When the ratio of surface area to weight is represented by SS (m²/g), the ratio of surface area to volume is represented by CS (m²/cc), and specific gravity is represented by ρ, the borosilicate glass powder preferably has a shape-smoothness index (ρ×SS/CS) of about 1.0–3.0.

Preferably, the insulating material additionally contains at least one species selected from the group consisting of a quartz powder, a vitreous silica powder and a high-silica glass powder.

Preferably, the insulating material also contains a low-melting glass. Preferably, the low-melting glass is a $Bi_2O_3$—$B_2O_3$—$SiO_2$ glass.

Preferably, the photosensitive organic vehicle contains an organic binder, a photopolymerization initiator and a photocurable monomer, and the organic binder is an acrylic copolymer having a carboxyl group and an ethylenic unsaturated group in side chains of the copolymer. Preferably, the acrylic copolymer is an acrylic/modified-cellulosic copolymer. Preferably, the acrylic/modified-cellulosic copolymer has a compositional ratio of about 3/1–10/1.

In another aspect of the present invention, there is provided a thick-film multi-layer circuit substrate comprising an insulating substrate, an insulating layer, and a conductive layer, the insulating layer and the conductive layer being formed on the insulating substrate, wherein the insulating layer is formed through exposure, development and firing, after the above-described photosensitive insulating paste according to the present invention is applied thereto.

Preferably, the insulating layer is provided between a first conductive layer and a second conductive layer, each of the conductive layers being formed of an Ag-type conductive material, a Cu-type conductive material or an Au-type conductive material, wherein the insulating layer contains a via hole electrically connecting the first conductive layer with the second conductive layer.

Some effects obtainable from the present invention will be summarized hereinbelow.

In the photosensitive insulating paste according to the present invention, the insulating material contains a borosilicate glass powder having the predetermined compositional proportions by weight as shown in FIG. 1, and the borosilicate glass powder of the proportions contains a relatively large amount of an $SiO_2$ component which has low reactivity with, for example, an organic binder. Therefore, the viscosity of the paste undergoes minimal changes with passage of time and a film can be formed in a consistent manner. As a result, micro-via holes of good shape can be formed with ease by means of photolithography. Moreover, the thermal expansion coefficient of the borosilicate glass powder can be freely set in accordance with the type of the substrate and the circuit pattern, since the thermal expansion coefficient can be varied with ease by suitably selecting the compositional proportions by weight of the borosilicate glass powder.

In the thick-film multi-layer circuit substrate according to the present invention, the insulating layer is formed of the photosensitive insulating paste of the present invention, and micro-via holes of good shape can be formed on the layer by means of photolithography. Thus, the densities of via holes and conductive patterns can be increased. In addition, the thermal expansion coefficient of the insulating layer can be suitably selected in accordance with the type of the substrate and the circuit pattern, and thus, a thick-film multi-layer circuit substrate having high reliability with suppressed camber and distortion can be obtained.

DETAILED DESCRIPTION OF THE INVENTION AND PREFERRED EMBODIMENTS

The photosensitive insulating paste and the thick-film multi-layer circuit substrate of the present invention will next be described in more detail.

Figure 1:
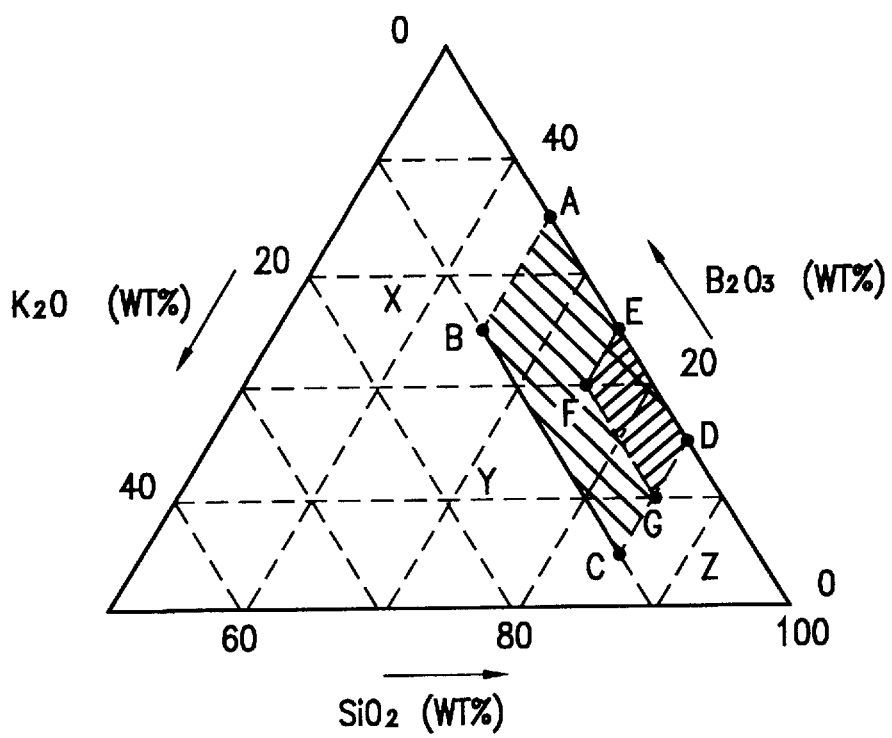
FIG. 1 is a ternary diagram showing a compositional region of a borosilicate glass powder contained in a photosensitive insulating paste of the present invention.

In the photosensitive insulating paste of the present invention, the borosilicate glass powder contains $SiO_2$, $B_2O_3$, and $K_2O$ and the compositional proportions by weight of the three components represented by ($SiO_2$, $B_2O_3$, $K_2O$) fall within a region formed by connecting points A (65, 35, 0), B (65, 25, 10), C (85, 5, 10) and D (85, 15, 0) in the ternary diagram shown in FIG. 1.

In the photosensitive insulating paste of the present invention, the compositional proportions by weight of the borosilicate glass powder are defined such that the borosilicate glass powder contains a large amount of $SiO_2$, which has low reactivity with an organic binder, and a relatively small amount of a component (particularly boron) having high reactivity with an organic vehicle, particularly a photosensitive organic binder having an acidic functional group such as a carboxyl group. Therefore, the change in viscosity of the photosensitive insulating paste due to ionic cross-linking or the like rarely occurs with passage of time, and film can be formed stably through a variety of techniques. Accordingly, the photosensitive conductive paste has excellent storage stability, and therefore micro-via holes having good shape can be formed with ease by means of photolithography.

The insulating layer—formed of the insulating material predominantly comprising the borosilicate glass having the above-described compositional proportions by weight—has a particularly low relative dielectric constant ∈r of 5 or less and high insulating reliability of at least $1×10^9$ (logIR≧9) as obtained in a wet loading test. In addition, in accordance with the type of the substrate material and conductive material, the thermal expansion coefficient of the layer can be suitably set within the range of, for example, 1.5–9 ppm/° C., by suitably selecting the compositional proportions of $SiO_2$, $B_2O_3$ and $K_2O$ within the region shown in FIG. 1. Thus, camber of a substrate caused by a mismatch of the thermal expansion coefficient can be suppressed, and there can be obtained a highly reliable, thick-film multi-layer circuit substrate which produces minimal deformation even when a plurality of substrates are stacked.

In contrast, an insulating layer in region X in the ternary diagram shown in FIG. 1 provides low insulation resistance in a wet loading test, resulting in unreliable insulation. In region Y in the ternary diagram shown in FIG. 1, the relative dielectric constant ∈r becomes high, which is a considerable disadvantage, particularly when the paste is used as an insulating layer in a thick-film multi-layer circuit substrate used in high-frequency components. In region Z in the ternary diagram shown in FIG. 1, since the sintering temperature for forming an insulating layer is high, the layer tends to be difficult to fire together with a low-melting metal having a low specific resistance, such as silver or copper.

In the photosensitive insulating paste of the present invention, the borosilicate glass powder more preferably has the compositional proportions by weight of the three components represented by ($SiO_2$, $B_2O_3$, $K_2O$) falling within a region formed by connecting points E (75, 25, 0), F (75, 20, 5), G (85, 10, 5) and D (85, 15, 0) in the ternary diagram shown in FIG. 1.

When the compositional proportions of the borosilicate glass powder fall within the above region, the obtained insulating layer provides a low relative dielectric constant ∈r of not higher than 4.5 and a high insulation resistance of at least $1 \times 10^{11}$ (logIR≧11) as obtained in a wet loading test. Therefore, a thick-film multi-layer circuit substrate having excellent high-frequency characteristics and insulation reliability can be obtained.

In the photosensitive insulating paste of the present invention, the insulating material preferably contains the borosilicate glass powder in an amount of at least about 60 wt. %. When the amount of the borosilicate glass powder is less than about 60 wt. %, the insulating layer containing the photosensitive insulating paste is difficult to sinter at not higher than 1000° C., and an initial short circuit and deterioration of insulating reliability in a wet loading test may result. The insulating material more preferably contains the borosilicate glass powder in an amount of about 60–80 wt. % in order to maintain good screen printing performance.

In the photosensitive insulating paste of the present invention, the insulating material preferably also contains at least one species selected from the group consisting of quartz powder, vitreous silica powder and high-silica glass powder.

Accordingly, when the insulating material contains, in addition to the borosilicate powder, a quartz powder (a crystalline $SiO_2$ powder), a vitreous silica powder (a vitreous $SiO_2$ powder) and/or a high-silica glass powder (a glass powder containing $SiO_2$ in an amount of 95% or more), there can be obtained an insulating layer having a desired thermal expansion coefficient which matches the thermal expansion coefficient of the circuit pattern and the substrate. Of the above-mentioned additional powders, high-silica glass powder is particularly advantageous, in that high-silica glass powder of consistent quality can be procured at low cost, as production thereof is easy and economical. In addition, the high-silica glass powder has high wettability with respect to the borosilicate glass powder, and thus sinterability of the high-silica glass powder may be enhanced to thereby enable formation of a dense sintered product. The insulating material preferably contains the above $SiO_2$-type inorganic powders in an amount of about 40 wt. % or less. When the amount of the powders is in excess of about 40 wt. %, sintering may be hampered.

In the photosensitive insulating paste of the present invention, the borosilicate glass powder in the insulating material preferably has a mean particle size of about 0.1–5 μm. Also, the quartz powder, the vitreous silica powder and the high-silica glass powder preferably have a mean particle size of about 0.1–5 μm.

When these inorganic powders have a mean particle size of less than about 0.1 μm, upon exposure of the layer formed of the photosensitive insulating paste, the amount of reflected and scattered light of exposure active rays from the surfaces of inorganic particles may increase and thus resolution of via holes may deteriorate. In contrast, when these inorganic powders have a mean particle size in excess of about 5 μm and there is exposure of the layer formed of the photosensitive insulating paste, the shape of the formed via hole becomes poor. Particularly, the particles in excess of about 5 μm may cause a decrease in roundness of the via holes and a decrease in insulation breakdown voltage.

In the photosensitive insulating paste of the present invention, when the ratio of surface area to weight is represented by SS ($m^2$/g), the ratio of surface area to volume is represented by CS ($m^2$/cc) and specific gravity is represented by ρ, the borosilicate glass powder preferably has a shape-smoothness index (ρ×SS/CS) of about 1.0–3.0. Also, the quartz powder, the vitreous silica powder, and the high-silica glass powder preferably have a shape-smoothness index of about 1.0–3.0.

When the inorganic powders including the borosilicate glass powder have a shape-smoothness index of about 1.0–3.0, the irregularities on the surfaces of these inorganic particles become low and the amount of scattered light of active rays decreases during exposure of the insulating layer, and thus the layer may provide via holes having a high degree of roundness and a small taper in a more consistent fashion. When these inorganic powders have a shape-smoothness index of about 1.0–2.0, the sintered layer has further improved density and an excellent Q value, which is particularly preferred.

In order to provide these inorganic powders with a shape-smoothness index of about 1.0–3.0, the powders can be subjected to several treatments; for example, a treatment wherein the powders are sprayed in a high-temperature atmosphere and rapidly cooled, an etching treatment, and a treatment wherein a sol of the powders is sprayed into a flame and rapidly cooled. These powders may be subjected to repeated treatments when the desired shape-smoothness index is difficult to obtain by a single treatment. In addition, the powders may be subjected to different treatments performed in combination.

In the photosensitive insulating paste of the present invention, preferably, the insulating material further contains a low-melting glass powder. The low-melting glass powder preferably has a melting point of about 450–550° C., and the insulating material preferably contains the glass powder in an amount of about 1–30 wt. %. When the amount of the low-melting glass powder is less than about 1 wt. %, the sintering process does not proceed smoothly, leaving pores in the layer, which may cause poor insulation between layers of a multi-layer circuit substrate. In contrast, when the amount is in excess of about 30 wt. %, the via holes tend to deform, and the diameter may become large. In addition, metallic components in a conductive material used for forming wiring tend to disperse into glass components, which may cause poor insulation.

The low-melting glass powder is preferably a $Bi_2O_3$—$B_2O_3$—$SiO_2$-type glass powder. The $Bi_2O_3$—$B_2O_3$—$SiO_2$-type glass powder realizes a low-melting point without use of PbO, which is considered to be problematic with respect to the environment. The glass powder provides an insulating material with high fluidity during sintering, and imparts improved insulating property to the insulating layer.

The aforementioned $Bi_2O_3$—$B_2O_3$—$SiO_2$ glass powder preferably comprises $Bi_2O_3$ in an amount of about 20–80 wt. %, $B_2O_3$ in an amount of about 5–35 wt. %, and $SiO_2$ in an amount of about 1–8 wt. %. When the $Bi_2O_3$ content is less than about 20 wt. %, the softening point of the glass is excessively high to thereby make sintering at 1000°

C. or lower difficult, whereas when the content is in excess of about 80 wt. %, the thermal expansion coefficient of the produced insulating layer tends to be excessively high. When the $B_2O_3$ content is less than about 5 wt. %, the glass becomes unstable to thereby tend to cause devitrification, whereas when the content in excess of about 35 wt. %, the glass has excessively high viscosity to thereby make firing at 1000° C. or lower difficult. Furthermore, when the $SiO_2$ content is less than about 1 wt. %, the glass has poor stability, whereas when the content is in excess of 8 wt. %, firing at 1000° C. or lower tends to become difficult.

In addition, the aforementioned $Bi_2O_3$—$B_2O_3$—$SiO_2$ glass powder preferably also contains $Al_2O_3$ powder. Incorporation of $Al_2O_3$ powder advantageously stabilizes the glass and lowers the melting point of the glass. The $Al_2O_3$ powder content based on the $Bi_2O_3$—$B_2O_3$—$SiO_2$ glass powder is preferably about 5 wt. % or less. When the content is in excess of about 5 wt. %, the glass may have an excessively high viscosity and be easily devitrified.

In the photosensitive insulating paste of the present invention, the photosensitive organic vehicle contains an organic binder, a photopolymerization initiator and a photocurable monomer, and the organic binder is preferably an acrylic copolymer having a carboxyl group and an ethylenic unsaturated group in the side chains.

When an acrylic copolymer having a carboxyl group and an ethylenic unsaturated group in the side chains is used as the organic binder, an aqueous solution of organic alkalis such as monoethanolamine or an aqueous solution of metallic alkali such as sodium carbonate can be used as a developing solution. Therefore, use of organic solvents having high toxicity, such as xylene, isoamyl acetate, butyl acetate and toluene, can be avoided. Meanwhile, the photopolymerization initiator and the photocurable monomer may contain known photosensitive components.

The acrylic copolymer is preferably an acrylic/modified-cellulosic copolymer, and the acrylic/modified-cellulosic copolymer preferably has a compositional ratio of about 3/1–10/1.

When an acrylic/modified-cellulosic polymer is used as an acrylic copolymer having a carboxyl group and an ethylenic unsaturated group in the side chains, and the compositional ratio of an acrylic component to modified-cellulose is about 3/1–10/1, a photosensitive insulating paste layer exhibiting high strength after drying can be formed, wherein via holes have good shape with a low degree of deformation. When the amount of an acrylic component is in excess of the above range, the photosensitive insulating paste layer weakly adheres to a substrate after the layer is dried, and the strength of the resultant film may decrease. In contrast, when the amount of modified cellulose is in excess of the above range, the modified cellulose absorbs active rays during exposure, and via holes may be deformed to a great extent.

The acrylic component of the aforementioned copolymer particularly preferably includes an acrylic copolymer having a carboxylic group in the side chains. The acrylic copolymer may be produced through copolymerization of an unsaturated carboxylic acid and an ethylenic unsaturated compound. Examples of unsaturated carboxylic acids include acrylic acid, methacrylic acid, maleic acid, fumaric acid and the anhydrides thereof. Vinyl acetate can also be used. Examples of ethylenic unsaturated compounds include acrylate esters such as methyl acrylate and ethyl acrylate; methacrylate esters such as methyl methacrylate and ethyl methacrylate; and fumarate esters such as monoethyl fumarate. The copolymer obtained through copolymerization of these monomers may be subjected to further treatment, e.g., oxidation treatment, to thereby introduce an unsaturated bond therein. The aforementioned modified cellulose may be produced from cellulose species such as methyl cellulose, hydroxyethyl cellulose, hydroxypropyl cellulose, hydroxymethyl cellulose and carboxymethyl cellulose as precursors.

As is described above, the photosensitive insulating paste of the present invention contains the borosilicate glass powder having the compositional proportions by weight shown in FIG. 1; the quartz powder; the vitreous silica powder; and the high-silica glass powder dispersed in an organic vehicle containing the organic binder, the photopolymerization initiator and the photocurable monomer. Minute via holes can be easily formed in the insulating holes by means of photolithography, which holes are difficult to form through screen printing.

Particularly, after firing of the paste containing borosilicate glass powder, quartz powder, vitreous silica powder and high-silica glass powder, a glass-ceramic insulating layer containing these inorganic powders is formed. Therefore, as compared with a resin insulating layer, the thus-formed layer has high durability at high temperature and high plating-resistance to an acidic plating solution.

The thick-film multi-layer circuit substrate of the present invention will next be described in more detail.

The thick-film multi-layer circuit substrate of the present invention comprises an insulating layer and a conductive layer formed on an insulating substrate. In order to form the insulating layer, the photosensitive insulating paste of the present invention is applied to the insulating substrate and the substrate is subjected to photolithography including exposure and development, and firing.

The insulating layer formed of the photosensitive insulating paste of the present invention can be fired at a temperature as low as 1000° C. or lower and has a low relative dielectric constant ($\in r$). In addition, the thermal expansion coefficient of the layer can be set in accordance with the material of the substrate and the conductor. Thus, the photosensitive insulating paste of the present invention provides a thick-film multi-layer circuit substrate having excellent high-frequency characteristics and high reliability with suppressed deformation such as camber or a warp.

Particularly, when the insulating layer contains via holes electrically connecting the first conductive layer with the second conductive layer, as is described above, the minute via holes, which are difficult to obtain through screen printing, can be formed in the insulating layer with high accuracy. In addition, the thick-film multi-layer circuit substrate having a small dimension and high density can be produced with ease.

The insulating layer formed by use of the photosensitive insulating paste of the present invention can be fired at a temperature as low as 1000° C. or lower. Thus, the aforementioned first and second conductive layers can be formed by use of a low-melting metal having low specific resistance, such as Ag, Ag—Pd, Ag—Pt, Cu or Au, to thereby provide a thick-film multi-layer circuit substrate having excellent high-frequency characteristics.

The insulating layer of the thick-film multi-layer circuit substrate of the present invention is characterized in that an insulating material forming the insulating layer has high viscosity at high temperature and that the alkaline earth metal content, which is said to be closely related to diffusion of metal ions into glass, is reduced to as low a level as possible. Thus, even when an Ag-containing conductive material is used as a conductive material for forming a wiring or an electrode, diffusion of Ag into glass caused by viscous flow is prevented to thereby provide an insulating layer having high reliability.

The thick-film multi-layer circuit substrate of the present invention will next be described by reference to a chip coil serving as an example.

Figure 2:
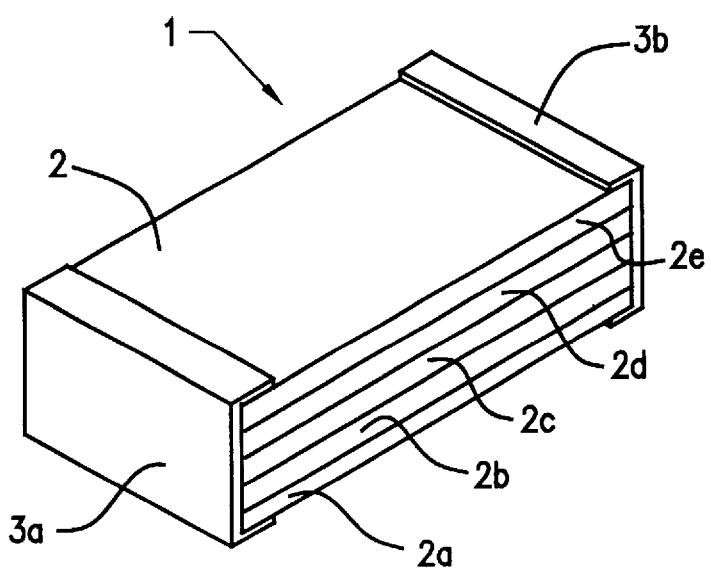
FIG. 2 is a schematic perspective view of a chip coil formed of a thick-film multi-layer circuit substrate of the present invention.
Figure 3:
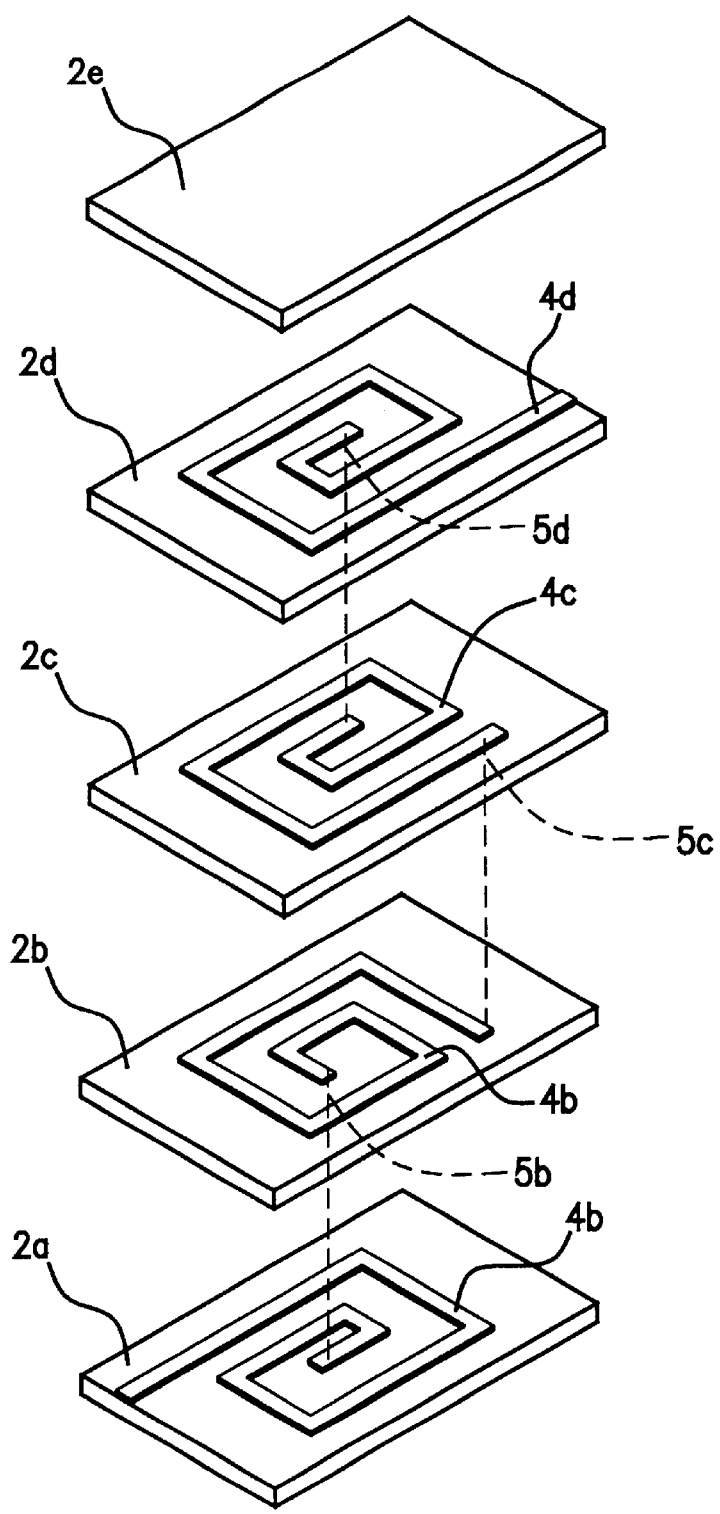
FIG. 3 is an exploded perspective view of the chip coil shown in FIG. 2.

As is shown in FIGS. 2 and 3, a chip coil 1 comprises an insulating substrate 2a formed of material such as alumina and, on this substrate 2a, insulating layers 2b, 2c, 2d and 2e which are produced from the photosensitive insulating paste of the present invention and are successively formed on the substrate 2a. In addition, the chip coil 1 comprises external electrodes 3a and 3b disposed at the respective longitudinal ends of the substrate 2 comprising the insulating substrate 2a and the insulating layers 2b to 2e; and internal electrodes 4a, 4b, 4c and 4d, each having a spiral shape, inside of the substrate 2.

Accordingly, within the substrate 2, the internal electrodes 4a, 4b, 4c and 4d, having a spiral shape and forming coil patterns are provided between the insulating substrate 2a and the insulating layer 2b, the insulating layers 2b and 2c, the insulating layers 2c and 2d and the insulating layers 2d and 2e, respectively. The internal electrode 4a provided between the insulating substrate 2a and the insulating layer 2b, and the internal electrode 4d provided between the insulating layers 2d and 2e are connected to the external electrodes 3a and 3b, respectively.

In addition, the internal electrode 4a (corresponding to the above-described first conductive layer) provided between the insulating substrate 2a and the insulating layer 2b is electrically connected to the internal electrode 4b (corresponding to the above-described second conductive layer) provided between the insulating layers 2b an 2c by the mediation of via hole 5b formed on the insulating layer 2b. In similar fashion, the internal electrodes 4b and 4c are electrically connected to the internal electrodes 4c and 4d, respectively, by the mediation of via holes 5c and 5d formed on the insulating layers 2c and 2d, respectively.

The insulating layers 2b to 2d and via holes 5b to 5d are formed by use of the above-described photosensitive insulating paste of the present invention through steps comprising applying, exposing, developing and firing, to thereby provide the via holes 5b, 5c, and 5d having micro-size and good shape. Meanwhile, the thermal expansion coefficients of the insulating layers 2b, 2c, 2d and 2e can be set to appropriate values in accordance with those of the insulating substrate 2a and the internal electrodes 4a to 4d, and thus, good conduction is provided between the internal electrodes, and camber of the substrate 2 is suppressed. Therefore, the chip coil 1 can be produced to have high reliability, with attaining small dimension and high density of patterns.

In addition, even when an Ag-type conductive material is used as material for forming the internal electrodes 4a, 4b, 4c and 4d, the Ag-containing conductive material has very low reactivity with respect to the insulating layers 2b, 2c, 2d and 2e, and therefore the insulating layer can be formed to prevent diffusion of Ag and to have high reliability. Furthermore, even when the insulating material is not subjected to any treatment such as stabilization, the viscosity of the photosensitive insulating paste rarely deteriorates with passage of time and consistent patterns can be formed.

The thick-film multi-layer circuit substrate of the present invention is not limited to the above-described chip coil 1, and is applicable to electronic components for high-frequency circuits, such as a chip capacitor and a chip LC filter, as well as to functional modules, such as VCOs (Voltage Controlled Oscillators) and PLLs (Phase Locked Loops) and hybrid ICs.

An example process for producing the chip coil 1 will next be described.

As is shown in FIG. 3, a photosensitive conductive paste predominantly containing Ag or a similar material is applied to the insulating substrate 2a containing alumina or a similar material. After the substrate is dried, the photosensitive conductive paste is exposed to light via a photo-mask, to thereby form a desired pattern. Subsequently, the paste is developed for removal of unnecessary conductive portions and is fired, for example, in air at 850° C. for one hour or thereabout, to thereby form the internal electrode 4a having a spiral shape.

The photosensitive conductive paste may be Fordel K3714 (product of Du Pont). The paste may be applied through screen printing, spin-coating, or a doctor-blade method.

Subsequently, the photosensitive insulating paste of the present invention is applied to the insulating substrate 2a so as to cover the internal electrode 4a to thereby form a photosensitive insulating paste layer. After the paste layer is dried, the layer is exposed to light via a photo-mask to thereby form patterns for via holes having a diameter of, for example, 50 µm. The layer is then developed for removal of unnecessary portions and is fired in air at a predetermined temperature for a predetermined time to thereby form the insulating layer 2b having pores for via holes. The photosensitive insulating paste may be applied through screen printing, spin-coating or a doctor-blade method.

Subsequently, a conductive material is charged into the pores for via holes and dried to thereby form the via hole 5b on the insulating layer 2b, which via hole connects one end of the internal electrode 4a with one end of the internal electrode 4b. After formation of the via hole, the internal electrode 4b having a spiral shape is formed in the same manner as described above.

Subsequently, in the same manner as described above, the photosensitive insulating paste of the present invention is applied to the insulating layer 2b so as to cover the internal electrode 4b to thereby form a photosensitive insulating paste layer. After the paste layer is dried, the layer is exposed to light via a photo-mask, to thereby form patterns for via holes having a diameter of, for example, 50 µm. The layer is then developed for removal of unnecessary portions and is fired in air at a predetermined temperature for a predetermined time to thereby form the insulating layer 2c having pores for via holes.

Subsequently, a conductive material is charged into the pores for via holes and dried to thereby form the via hole 5c on the insulating layer 2c, which via hole connects one end of the internal electrode 4b with one end of the internal electrode 4c. After formation of the via hole, the internal electrode 4c having a spiral shape is formed in the same manner as described above.

Furthermore, in the same manner as described above, the photosensitive insulating paste of the present invention is applied to the insulating layer 2c so as to cover the internal electrode 4c to thereby form a photosensitive insulating paste layer. After the paste layer is dried, the layer is exposed to light via a photo-mask, to thereby form patterns for via holes having a diameter of, for example, 50 µm. The layer is then developed for removal of unnecessary portions and is fired in air at a predetermined temperature for a predetermined time to thereby form the insulating layer 2d having pores for via holes.

Subsequently, a conductive material is charged into the pores for via holes and dried to thereby form the via hole 5d on the insulating layer 2d, which via hole connects one end of the internal electrode 4c with one end of the internal electrode 4d. After formation of the via hole, the internal electrode 4d having a spiral shape is formed in the same manner as described above.

Subsequently, an insulating paste or the photosensitive insulating paste of the present invention is applied to the insulating layer 2d so as to cover the internal electrode 4d to thereby form an insulating paste layer. After the paste layer is dried, the layer is fired in air at a predetermined temperature for a predetermined time to thereby form the insulating layer 2e for protection. Thereafter, the external electrodes 3a and 3b are provided to thereby obtain the chip coil having a monolithic structure containing the internal electrodes of spiral shape and the insulating layers.

In the above-described production process, the photosensitive insulating paste of the present invention is used for forming the insulating layers 2b, 2c and 2d, and therefore, minute via holes having good shape can be formed with ease.

The viscosity of the photosensitive insulating paste of the present invention used for the formation of the insulating layers 2b, 2c and 2d hardly decreases with passage of time to thereby attain excellent storage stability. Thus, bleeding or a similar phenomenon attributed to deterioration of viscosity may be suppressed. In addition, very minute via holes having a diameter of less than 150 μm, particularly 50 μm or less, may be formed at high accuracy, and thus circuit substrates and electronic components for a circuit having a smaller size and higher density can be obtained.

In the above-described production process for the chip coil, the internal electrodes 4a to 4d may be formed through screen printing by use of a typically employed conductive paste or through photolithography by use of a photo-resist. In addition, electronic components for high-frequency circuits such as chip capacitors and chip LC filters, and high-frequency circuit substrates including high-frequency modules such as VCOs and PLLs can be produced in substantially the same manner as described above.

EXAMPLES

The present invention will next be described by way of examples.

Example 1

$SiO_2$, $B_2O_3$ and $K_2CO_3$ were procured as starting materials for preparing a borosilicate glass powder, and were mixed so as to attain respective compositions shown in Table 1. The resultant mixture was melted at 1500–1750° C. so as to obtain molten glass. The molten glass was quenched by use of a quenching roller and ground, to thereby obtain a borosilicate glass powder. Thus, three types of the powder, which are represented by glass Nos. 2, 4, and 8, were obtained.

TABLE 1

| | Composition of borosilicate glass (wt. %) | | |
|---|---|---|---|
| Glass No. | $SiO_2$ | $B_2O_3$ | $K_2O$ |
| 2 | 65 | 25 | 10 |
| 4 | 85 | 15 | 0 |
| 8 | 79 | 19 | 2 |

Subsequently, the thus-obtained borosilicate glass powder, a quartz powder, and a vitreous silica powder were blended so as to attain respective compositions shown in Table 2, and appropriate amounts of an organic binder and alcohol were added thereto. The resultant mixture was wet-mixed by use of a zirconia ball mill or a like apparatus for 3–4 hours, and then dried to an appropriate degree so as to obtain a homogeneous inorganic powder consisting of the borosilicate glass powder, the quartz powder and the vitreous silica powder. The obtained inorganic powder was used as the insulating material.

Subsequently, the inorganic powder for preparing an insulating material was press-formed into a ceramic compact of 5 mmφ. The thus-prepared ceramic compacts were heated at a temperature elevation rate of 200° C./hr and fired at respective temperatures shown in Table 2 for two hours to thereby obtain sintered ceramic products formed of insulating materials a—r.

TABLE 2

| Insulating material | Borosilicate glass powder | | Quartz powder (wt. %) | Vitreous silica powder (wt. %) | Firing temperature (° C.) |
|---|---|---|---|---|---|
| | Glass No. | (wt. %) | | | |
| a | 2 | 100 | 0 | 0 | 950° C. |
| b | 2 | 60 | 40 | 0 | 950° C. |
| c | 2 | 60 | 0 | 40 | 950° C. |
| d | 2 | 60 | 20 | 20 | 950° C. |
| e | 2 | 50 | 50 | 0 | 950° C. |
| f | 2 | 50 | 0 | 50 | 950° C. |
| g | 4 | 100 | 0 | 0 | 1000° C. |
| h | 4 | 60 | 40 | 0 | 1000° C. |
| i | 4 | 60 | 0 | 40 | 1000° C. |
| j | 4 | 60 | 20 | 20 | 1000° C. |
| k | 4 | 50 | 50 | 0 | 1000° C. |
| l | 4 | 50 | 0 | 50 | 1000° C. |
| m | 8 | 100 | 0 | 0 | 950° C. |
| n | 8 | 60 | 40 | 0 | 950° C. |
| o | 8 | 60 | 0 | 40 | 950° C. |
| p | 8 | 60 | 20 | 20 | 950° C. |
| q | 8 | 50 | 50 | 0 | 950° C. |
| r | 8 | 50 | 0 | 50 | 950° C. |

The sintered ceramic products each formed of one of insulating materials a–r were evaluated for thermal expansion coefficient. By use of a dilatometer, the thermal expansion coefficient was measured up to 500° C. with respect to a reference temperature of 30° C. The results are shown in Table 3.

TABLE 3

| Insulating material | Thermal expansion coefficient |
|---|---|
| a | 5.0 |
| b | 8.5 |
| c | 3.2 |

TABLE 3-continued

| Insulating material | Thermal expansion coefficient |
|---|---|
| d | 6.5 |
| e | 10.0 |
| f | 3.3 |
| g | 2.0 |
| h | 7.6 |
| i | 1.5 |
| j | 4.6 |
| k | 8.9 |
| l | 1.5 |
| m | 2.5 |
| n | 7.9 |
| o | 1.8 |
| p | 5.0 |
| q | 9.0 |
| r | 1.5 |

As shown in Table 3, among the sintered ceramic products each formed of one of insulating materials e, f, k, l, q, and r containing the borosilicate glass powder in an amount of less than 60 wt. %, the products formed of insulating materials e, k, and q consisting of the borosilicate glass powder and the quartz powder tend to provide excessively high thermal expansion coefficients, whereas the products formed of insulating materials f,l, and r consisting of the borosilicate glass powder and the vitreous silica powder tend to provide excessively low thermal expansion coefficients.

In contrast, the sintered ceramic products formed of insulating material a–d, g–j or m–p containing the borosilicate glass powder in an amount of at least about 60 wt. % provide thermal expansion coefficients falling within the range of about 1.5–9 ppm/° C., and provide thermal expansion coefficients that can be freely set by suitably setting the compositional proportions of the borosilicate glass powder.

Particularly, when the insulating material is formed of borosilicate glass powder, quartz powder and vitreous silica powder as in the case of ceramic sintered bodies produced by use of insulating material d, j, or p, the resultant ceramic sintered product is stable and has a relatively low thermal expansion coefficient falling in the vicinity of 4.0–6.5.

Example 2

The borosilicate glass powder, quartz powder and vitreous silica powders of insulating materials a–r were used. Subsequently, the respective powders (60 parts by weight) and a photosensitive organic vehicle (PER-800 series, product of GOO CHEMICAL CO., LTD) (40 parts by weight) were mixed, followed by kneading to thereby obtain photosensitive insulating pastes.

The above-prepared respective photosensitive insulating pastes were applied to an insulating substrate through screen printing to thereby form a photosensitive insulating paste layer. Stainless mesh #325 was used as a screen printing plate. Screen printing was performed under the following conditions: squeegee pressure 5 kg/cm$^2$, squeegee speed 50 mm/second, angle of attack 70° and screen distance 1.5 mm.

After the photosensitive insulating paste was applied to the insulating substrate under the above conditions, the paste was subjected to leveling for 10 minutes or more and dried in a drying apparatus at 90° C. for 60 minutes to thereby vaporize the solvent component in the paste. Subsequently, the substrate was removed from the apparatus and the surface temperature of the substrate was confirmed to reach room temperature ±2° C. to thereby ensure the size of the substrate returning to that before drying, obtaining thick-film multi-layer circuit substrates represented by Test Example Nos. 1 to 18 shown in Table 4.

The method for evaluation of the thick-film multi-layer circuit substrate will next be described in more detail.

Figure 4:
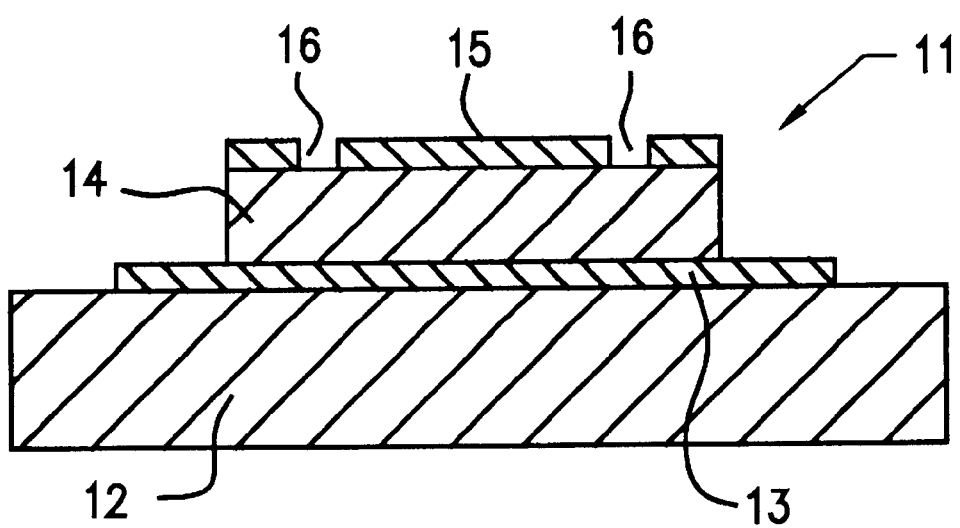
FIG. 4 is a schematic sectional view of a thick-film multi-layer circuit substrate used for evaluation of relative dielectric constant and insulating reliability in the Test Examples of the present invention.

As is shown in FIG. 4, an alumina substrate having a thickness of 0.635 mm and a size of 10 cm×10 cm was prepared as an insulating substrate 12. On the substrate 12, a conductive paste predominantly containing Ag/Pt was applied through screen printing and the paste layer was fired in air at 850° C. to thereby form a disk-shaped conductive undercoat layer 13 having a film thickness of about 8 mm after firing and a diameter of 8 mm, which layer served as one electrode of a capacitor.

Subsequently, one of the above-prepared photosensitive insulating pastes formed of one of insulating materials a–r was applied to the conductive undercoat layer through screen printing, the paste layer was exposed to UV rays of 50 mj/cm$^2$ by means of photolithography and the resultant layer was developed by use of a 0.5 wt. % aqueous solution of sodium carbonate. In addition, the thus-obtained layer was fired in air at a temperature shown in Table 4 to thereby form a disk-shaped insulating layer 14 having a film thickness of about 40 μm after firing and a diameter of 6 mm.

Next, a conductive paste predominantly containing Ag was applied to the insulating layer 14 through screen printing and the paste was fired in air to thereby form a conductive overcoat layer 15 having a diameter of 4 mm. The layer 15 was surrounded by a guard 16 having a width of 500 μm and served as the other electrode of a capacitor. Through the above-described procedure, a thick-film multi-layer circuit substrate 11 was completed.

Characteristics of the insulating layer 14 were assessed through measurement of characteristics of a capacitor containing the conductive undercoat layer 13 and the conductive overcoat layer 15 as counter electrodes and the insulating layer 14 as a dielectric layer. The capacitor was isolated from the surroundings by use of a guard electrode, and capacitance of the capacitor was measured under the following conditions: frequency 1 MHZ, voltage 1 Vrms and temperature 25° C. Relative dielectric constant ∈r was obtained from the above-measured capacitance and the size of the capacitor. In addition, insulating reliability (insulation resistance logIR) was evaluated for the insulating layer by the application of a direct current voltage of 100 V for one minute after a voltage of 100 V had been applied to the layer for 1,000 hours at 85° C. and 85% RH.

Figure 5A:
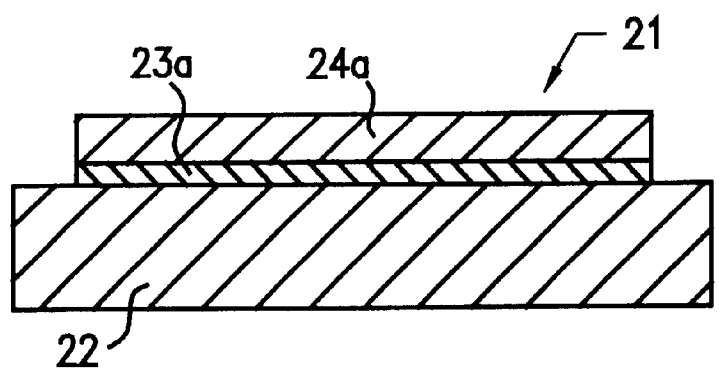
FIGS. 5A to 5C are schematic sectional views of a thick-film multi-layer circuit substrate used for evaluation of camber in the examples of the present invention.
Figure 5B:
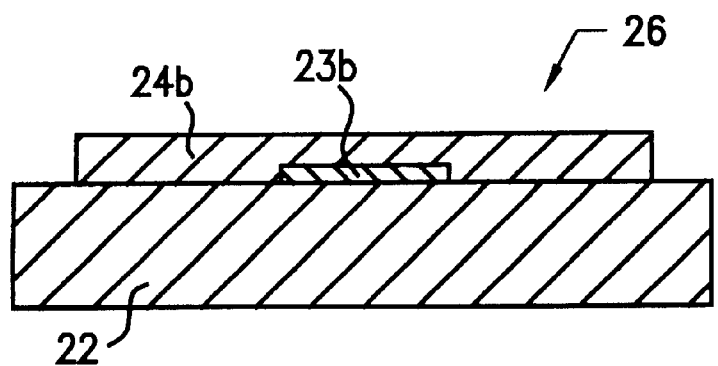
Figure 5C:
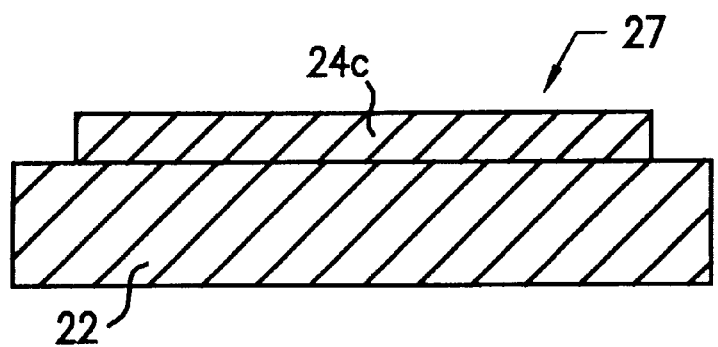

In order to measure the camber of a thick-film multi-layer circuit substrate, substrates 21, 26, and 27 shown in FIGS. 5A, 5B, and 5C, respectively, were prepared.

The substrate 21 shown in FIG. 5A comprises an insulating layer 24a, which was obtained through the following procedure. On an Al$_2$O$_3$ insulating substrate 22 having a thickness of 0.635 mm and a size of 10 cm×10 cm, a conductive paste predominantly containing Ag/Pt was applied through screen printing and the paste layer was fired in air at 850° C. to thereby form a conductive pattern 23a having a film thickness of about 8 μm and a size of 9 cm×9 cm. Subsequently, the above-prepared photosensitive insulating paste was applied to the conductive pattern 23a through screen printing such that the paste layer had a size of 9 cm×9 cm and a film thickness of about 40 μm after firing, and the layer was fired in air at a predetermined temperature to thereby obtain the insulating layer 24a.

The substrate 26 shown in FIG. 5B comprises an insulating layer 24b, which was obtained through the following procedure. On the $Al_2O_3$ insulating substrate 22 having a thickness of 0.635 mm and a size of 10 cm×10 cm, a conductive paste predominantly containing Ag/Pt was applied through screen printing and the paste layer was fired in air at 850° C. to thereby form a conductive pattern 23b having a film thickness of about 8 μm and a size of 3 cm×3 cm. Subsequently, the above-prepared photosensitive insulating paste was applied to the conductive pattern 23b and to the insulating substrate 22 through screen printing such that the paste layer had a size of 9 cm×9 cm and a film thickness of about 40 μm after firing, and the layer was fired in air at a predetermined temperature, to thereby obtain the insulating layer 24b.

The substrate 27 shown in FIG. 5C comprises an insulating layer 24c, which was obtained through the following procedure. On the $Al_2O_3$ insulating substrate 22 having a thickness of 0.635 mm and a size of 10 cm×10 cm, the above-prepared photosensitive insulating paste was applied through screen printing such that the paste layer had a size of 9 cm×9 cm and a film thickness of about 40 μm after firing, and the layer was fired in air at a predetermined temperature, to thereby obtain the insulating layer 24c.

Degrees of camber of the substrates 21, 26 and 27 were measured by use of a micrometer. On a flat plate having a size at least 10 cm×10 cm, each substrate was measured for thickness when placed with one surface up and then when placed with the other surface up. The difference between the two measurements represented the degree of camber. In Table 4, A, B and C in "Degree of camber" represents the degrees of camber of the substrates 21, 26 and 27, respectively.

Table 4 shows the obtained data of relative dielectric constant ($\epsilon r$), insulating reliability (insulation resistance logIR) and degree of camber of the thick-film multi-layer circuit substrates, as well as the firing temperature of the insulating layers.

TABLE 4

| Test Example No. | Insulating material | $\epsilon r$ | Insulation resistance log IR | Degree of camber A | B | C | Firing temperature (° C.) |
|---|---|---|---|---|---|---|---|
| 1 | a | 5.0 | >9 | 0 | 600 | 650 | 900 |
| 2 | b | 4.5 | >9 | −300 | −100 | −50 | 900 |
| 3 | c | 4.5 | >9 | 100 | 700 | 750 | 900 |
| 4 | d | 4.5 | >9 | 50 | 450 | 500 | 900 |
| 5 | e | 4.0 | <9 | −400 | −100 | −100 | 1000 |
| 6 | f | 4.1 | <9 | 50 | 600 | 650 | 1000 |
| 7 | g | 3.8 | >11 | 200 | 750 | 800 | 1000 |
| 8 | h | 3.8 | >11 | −100 | 100 | 200 | 1000 |
| 9 | i | 3.8 | >11 | 250 | 750 | 800 | 1000 |
| 10 | j | 3.8 | >11 | 0 | 600 | 700 | 1000 |
| 11 | k | 3.6 | <9 | −300 | −150 | −100 | 1000 |
| 12 | l | 3.6 | <9 | 150 | 550 | 600 | 1000 |
| 13 | m | 3.8 | >11 | 150 | 750 | 800 | 900 |
| 14 | n | 3.8 | >11 | −150 | 50 | 50 | 900 |
| 15 | o | 3.8 | >11 | 200 | 700 | 800 | 900 |
| 16 | p | 3.8 | >11 | −50 | 600 | 650 | 900 |
| 17 | q | 3.7 | <9 | −300 | −100 | −100 | 1000 |
| 18 | r | 3.6 | <9 | 200 | 550 | 600 | 1000 |

As is apparent from Test Examples 5, 6, 11, 12, 17 and 18, the thick-film multi-layer circuit substrates each formed of insulating materials e, f, k, l, q or r containing the borosilicate glass powder in an amount of less than 60 wt. % tend to provide high relative dielectric constant $\epsilon r$ and low insulation as obtained in a wet loading test.

In contrast, as is apparent from Test Examples 1–4, 7–10 and 13–16, the thick-film multi-layer circuit substrates formed of insulating materials containing the borosilicate glass powder in an amount of 60 wt. % or more provide high insulating reliability and low dielectric constant. Also, as shown in Example 1, the thermal expansion coefficient can be suitably adjusted within the range of 1.5–9 ppm/° C. in accordance with the characteristics of the insulating substrate and the circuit pattern, and thus a thick-film multi-layer circuit substrate with suppressed camber can be obtained.

Example 3

$SiO_2$, $B_2O_3$, and $K_2CO_3$ were procured as starting materials for preparing a borosilicate glass component and were mixed in appropriate amounts so as to attain respective compositions shown in Table 5. The resultant mixture was melted at 1500–1750° C. so as to obtain molten glass. The molten glass was quenched by use of a quenching roller and ground, to thereby obtain borosilicate glass powders represented by Glass Nos. 1 to 11 in Table 5 below.

TABLE 5

| Glass No. | Composition of borosilicate glass (wt. %) | | |
|---|---|---|---|
| | $SiO_2$ | $B_2O_3$ | $K_2O$ |
| 1 | 65 | 35 | 0 |
| 2 | 65 | 25 | 10 |
| 3 | 85 | 5 | 10 |
| 4 | 85 | 15 | 0 |
| 5 | 75 | 25 | 0 |
| 6 | 75 | 20 | 5 |
| 7 | 85 | 10 | 5 |
| 8 | 79 | 19 | 2 |
| 9 | 60 | 30 | 10 |
| 10 | 70 | 10 | 20 |
| 11 | 90 | 5 | 5 |

Subsequently, the above-prepared respective borosilicate glass powders, a quartz powder and a vitreous silica powder were blended so as to attain the following composition: borosilicate glass powder/quartz powder/vitreous silica powder=80/10/10 (wt. %) to thereby obtain powder mixtures. A photosensitive organic vehicle (PER-800 series, product of GOO CHEMICAL CO., LTD) (40 parts by weight) was added to the above-obtained respective borosilicate glass powders (100 parts by weight) as well as to the respective powder mixtures (100 parts by weight), followed by kneading, to thereby obtain photosensitive insulating pastes.

The thus-obtained photosensitive insulating pastes were applied through screen printing to an insulating substrate to thereby form a photosensitive insulating paste layer. Stainless mesh #325 was used as a screen printing plate. Screen printing was performed under the following conditions: squeegee pressure 5 kg/cm$^2$, squeegee speed 50 mm/second, angle of attack 70° and screen distance 1.5 mm.

After the photosensitive insulating paste was applied to the insulating substrate, the paste was subjected to leveling for 10 minutes or more and dried in a drying apparatus at 90° C. for 60 minutes to thereby vaporize the solvent component in the paste. Subsequently, the substrate was removed from the apparatus, the surface temperature of the substrate was confirmed to reach room temperature ±2° C., and the substrate was confirmed to have the same size as before drying to thereby obtain a thick-film multi-layer circuit substrate.

The above-obtained thick-film multi-layer circuit substrate was prepared in the same manner as the thick-film multi-layer circuit substrate 11 as described in Example 2 (see FIG. 4). Characteristics of the insulating layer 14 were assessed through measurement of characteristics of a capacitor containing the conductive undercoat layer 13 and the conductive overcoat layer 15 as counter electrodes and the insulating layer 14 as a dielectric layer.

The capacitor was isolated from the surroundings by use of a guard electrode, and capacitance of the capacitor was measured under the following conditions: frequency 1 MHZ, voltage 1 Vrms and temperature 25° C. Relative dielectric constant ($\in r$) was obtained from the above-measured capacitance and the size of the capacitor. In addition, insulating reliability (insulation resistance logIR) was evaluated for the insulating layer by the application of a direct current voltage of 100 V for one minute after a voltage of 100 V had been applied to the layer for 1,000 hours at 85° C. and 85% RH. The obtained relative dielectric constants and insulating reliabilities of the thick-film multi-layer circuit substrate 11 are shown in Table 6 below.

TABLE 6

| Test Example No. | Composition | Glass No. | $\in r$ | Insulation resistance log IR | Firing temperature (° C.) |
|---|---|---|---|---|---|
| 19 | A | 1 | 4.0 | >9 | 900 |
| 20 | A | 2 | 5.0 | >9 | 900 |
| 21 | A | 3 | 5.0 | >9 | 900 |
| 22 | A | 4 | 3.8 | >11 | 1000 |
| 23 | A | 5 | 4.0 | >11 | 900 |
| 24 | A | 6 | 4.5 | >11 | 900 |
| 25 | A | 7 | 4.5 | >11 | 900 |
| 26 | A | 8 | 3.9 | >11 | 900 |
| 27 | A | 9 | 5.8 | <9 | 900 |
| 28 | A | 10 | 7.8 | >9 | 900 |
| 29 | A | 11 | Not sintered | | 1000 |
| 30 | B | 1 | 4.0 | >9 | 900 |
| 31 | B | 2 | 4.8 | >9 | 900 |
| 32 | B | 3 | 4.8 | >9 | 900 |
| 33 | B | 4 | 3.8 | >9 | 1000 |
| 34 | B | 5 | 3.9 | >11 | 900 |
| 35 | B | 6 | 4.4 | >11 | 900 |
| 36 | B | 7 | 4.4 | >11 | 900 |
| 37 | B | 8 | 3.9 | >11 | 900 |
| 38 | B | 9 | 5.2 | <9 | 900 |
| 39 | B | 10 | 7.1 | >9 | 900 |
| 40 | B | 11 | Not sintered | | 1000 |

"A" in the column of "Composition" refers to the paste containing the borosilicate glass powder (100 parts by weight), whereas "B" represents the paste containing the powder mixture having the composition: borosilicate glass powder/quartz powder/vitreous silica powder=80/10/10 (parts by weight).

As is apparent from Test Examples 27 and 38, when a borosilicate glass powder of the compositional proportions of the components in region X shown in FIG. 1 is used, the product has an insulation resistance of less than 1×10$^9$ (logIR<9) as obtained in a wet loading test, i.e., low insulating reliability. As is apparent from Test Examples 28 and 39, when a borosilicate glass powder of the compositional proportions of the components in region Y shown in FIG. 1 is used, the product has a high relative dielectric constant $\in r$ of far greater than 6.0, and thus, characteristics of the substrate deteriorate at high frequency. In addition, as is apparent from Test Examples 29 and 40, when a borosilicate glass powder of the compositional proportions of the components in region Z shown in FIG. 1 is used, the insulating layers cannot be fired at 1,000° C. or less, and thus are difficult to fire together with a conductive material having a low specific resistance and predominantly comprising silver or copper.

In contrast, as is apparent from Test Examples 19 to 26 and 30 to 37, when a borosilicate glass powder of the compositional proportions by weight of the components in a region formed by connecting points A, B, C and D shown in FIG. 1 is used, firing at 1,000° C. or less is possible, and the insulating layers have an insulation resistance of 1×10$^9$ or more (logIR>9), i.e., high insulating reliability. In addition, the layers have a low relative dielectric constant $\in r$ of 5.0 or less.

Particularly, as is apparent from Test Examples 22 to 26 and 33 to 37, when a borosilicate glass powder of the compositional proportions by weight of the components in a region formed by connecting points E, F, G and D shown in FIG. 1 is used, firing at 1,000° C. or less or even 900° C. or less is possible, and the insulating layers have an insulation resistance of 1×10$^{11}$ or more (logIR>11), i.e., considerably high insulating reliability. In addition, the layers have a low relative dielectric constant $\in r$ of 4.5 or less.

As is apparent from Test Examples 19 to 26 and 30 to 37, the insulating layer formed of an insulating material containing a borosilicate glass powder, a quartz powder and a vitreous silica powder (Test Examples 30–37) has a lower relative dielectric constant $\in r$ and excellent high-frequency characteristics, as compared with the insulating layer formed of an insulating material containing only a borosilicate glass powder (Test Examples 19–26).

Example 4

SiO$_2$, B$_2$O$_3$, and K$_2$O were procured as starting materials for preparing a borosilicate glass powder, and were mixed in appropriate amounts so as to attain the following compositional proportions: SiO$_2$/B$_2$O$_3$/K$_2$O=79/19/2 (wt. %). The resultant mixture was melted at 1700° C. so as to obtain molten glass. The molten glass was quenched by use of a quenching roller and ground to thereby obtain borosilicate glass powders having a mean particle size (D$_{50}$) of 3.0 μm. Meanwhile, a quartz powder and a vitreous silica powder were ground in a pot to thereby obtain quartz powders and vitreous silica powders having a mean particle size of 3.0 μm. Subsequently, the thus-obtained borosilicate glass powders, quartz powders and vitreous silica powders were sprayed in a high-temperature atmosphere and quenched.

The number of steps for quenching was varied within a range of 1 to 5 to thereby obtain inorganic powders, i.e, borosilicate glass powders, quartz powders, and vitreous silica powders, having a variety of shape-smoothness indexes as shown in Table 7 below. More specifically, Test Examples 41, 42, 43, 44 and 45 were subjected to quenching in one, two, three, four and five steps, respectively, in order to reduce surface irregularities.

Shape-smoothness index was determined as follows. First, the ratio of surface area to weight SS (m$^2$/g) of each of the borosilicate glass powders, the quartz powders and the vitreous silica powders was measured by use of an inert-gas-adsorbing automatic surface area meter. Then, the ratio of surface area to volume CS (m$^2$/cc) of the respective powders was measured by use of a laser Doppler analysis particle size distribution meter, followed by measurement of specific gravity ρ by use of a specific gravity meter. Subsequently, ρ×SS/CS was calculated from the above results and the thus-calculated value was used as the shape-smoothness index.

One of the quartz powders, one of the vitreous silica powders and one of the borosilicate glass powders of Test Examples 41 to 45 were mixed to prepare an inorganic powder having the following composition: quartz powder/ vitreous silica powder/borosilicate glass powder=10/10/80 (wt. %). Subsequently, in a room equipped with a yellow fluorescent lamp, the respective above-prepared inorganic powder (50 wt. %) and a photosensitive organic vehicle of PER-800 series (product of GOO CHEMICAL CO., LTD) containing an organic binder, a photopolymerization initiator and a photocurable monomer (50 wt. %) were mixed. The resultant mixture was kneaded by use of a stirrer and a three-roll mill to thereby prepare a photosensitive insulating paste.

Next, in the same manner as described in Example 3, the respective photosensitive insulating pastes of Test Examples 41 to 45 were applied through screen printing to the entire surface of an insulating substrate having an electrode, to thereby form a photosensitive insulating paste layer. In this case, stainless mesh #325 was used as a screen printing plate. Screen printing was performed under the following conditions: squeegee pressure 5 kg/cm$^2$, squeegee speed 50 mm/second, angle of attack 70° and screen distance 1.5 mm.

After the respective photosensitive insulating paste was applied to the insulating substrate, the paste was subjected to leveling for 10 minutes or more and dried in a drying apparatus at 90° C. for 60 minutes, to thereby evaporate solvent components. Subsequently, the substrate was removed from the apparatus and the surface temperature of the substrate was confirmed to reach room temperature ±2° C. to thereby ensure the size of the substrate returning to that before drying. The substrate was exposed to UW rays of 200 mj/cm$^2$ by use of an exposure apparatus equipped with a photo-mask to thereby form via holes having a diameter of 50 μm. Proximity exposure was used as the exposure method. After exposure, any region on the substrate which had not been exposed was removed by use of a spray-shower-type developing apparatus. A 0.5 wt. % aqueous solution of sodium carbonate was used as a developing solution.

After developing, the substrate was washed with water and dried again in a drying apparatus for 30 minutes to thereby evaporate water thoroughly. Subsequently, the photosensitive insulating paste layer was fired in a belt-type firing apparatus under the following conditions: heating rate 50° C./minute, maximum temperature 900° C., retention time at maximum firing temperature 10 minutes and cooling rate 50° C./minute to thereby form on the insulating substrate an insulating layer containing via holes having a diameter of 50 μm.

The above-obtained insulating layers formed of the respective photosensitive insulating pastes according to Test Examples 41 to 45 were measured for relative dielectric constant ∈r and Q value at a frequency of 1 MHZ. In addition, the shape and taper of the via holes contained in the insulating layers and having a diameter of 50 μm were assessed. The results are shown in Table 7 below.

The shape of the via holes having a diameter of 50 μm was observed from the top under a microscope, and roundness of each hole was assessed in terms of ratings AA, BB, CC, and DD indicating roundness in sequence from good to poor. In the case in which a hole has significant irregularity and its shape is far from round, a rating DD was assigned. Meanwhile, in order to assess the taper of the via hole having a diameter of 50 μm, difference in diameter between the upper side and the lower side of the sectional-view of the hole was obtained by use of a microscopic-length measuring apparatus. The thus-obtained difference was assessed in terms of the following expressions "very large," "large," "small," and "very small."

TABLE 7

| Test Example No. | Shape-smoothness index | Shape of via holes | Taper of via holes | ∈r 1 MHz | Q value 1 MHz |
|---|---|---|---|---|---|
| 41 | 3.8 | DD | Very large | 3.7 | 750 |
| 42 | 3.2 | CC | Large | 3.8 | 860 |
| 43 | 2.8 | BB | Small | 3.9 | 1130 |
| 44 | 1.7 | AA | Very small | 3.9 | 1440 |
| 45 | 1.3 | AA | Very small | 3.9 | 1550 |

As is apparent from Table 7, as in the cases of Test Examples 41 and 42, when the shape-smoothness index of the borosilicate glass powder, the quartz powder, or the vitreous silica powder is in excess of 3.0, the via holes have poor shape and tend to have large taper. The inorganic powder particle of a high shape-smoothness index has relatively large irregularity on the surface and therefore, when the particle is exposed to light, a large amount of active rays, for example, rays in a UV region, are scattered on the surface of each particle. As a result, it is difficult to form via holes having high roundness and low taper.

In contrast, as in the cases of Test Examples 43 to 45, when the shape-smoothness index is 3.0 or less, surface irregularity of each inorganic particle is suppressed. Therefore, when the particle is exposed to light, the amount of scattered active rays becomes low and via holes having high roundness and small taper can be formed. Particularly, as in the cases of Test Examples 44 and 45, when the shape-smoothness index is 1.0–2.0, the sintered product formed from the particles has higher density and has a Q value as high as 1400 or more at 1 MHZ.

As is described above, the shape-smoothness index of the borosilicate glass powder, the quartz powder and the vitreous silica powder is preferably about 1.0–3.0, more preferably about 1.0–2.0, which index is obtained by the following formula: ρ×SS/CS wherein SS represents the ratio of surface area to weight (m$^2$/g), CS represents the ratio of surface area to volume (m$^2$/cc), and ρ represents specific gravity.

Example 5

SiO$_2$, B$_2$O$_3$, and K$_2$O were procured as starting materials for preparing a borosilicate glass powder contained in a photosensitive insulating paste, and were mixed in appropriate amounts so as to attain the following composition: SiO$_2$/B$_2$O$_3$/K$_2$O=79/19/2 (wt. %). The resultant mixture was melted at 1700° C. so as to obtain molten glass.

The molten glass was quenched by use of a quenching roller and ground to thereby obtain borosilicate glass powders, as in the cases of Test Examples 46 to 50 shown in Table 8 below, having mean particle sizes of 7.3 μm (Test Example 46), 5.5 μm (Test Example 47), 4.8 μm (Test Example 48), 0.1 μm (Test Example 49) and 0.05 μm (Test Example 50). Meanwhile, a quartz powder and a vitreous silica powder were ground in a pot, to thereby obtain quartz powders and vitreous silica powders having mean particle sizes of 7.3 μm (Test Example 46), 5.5 μm (Test Example 47), 4.8 μm (Test Example 48), 0.1 μm (Test Example 49) and 0.05 μm (Test Example 50). Subsequently, the above-obtained borosilicate glass powders, the quartz powders and the vitreous silica powders were sprayed in a high-temperature atmosphere to thereby form the borosilicate glass powders, the quartz powders and the vitreous silica powders having a shape-smoothness index of 1.7.

One of the quartz powders, one of the vitreous silica powders, and one of the borosilicate glass powders were mixed to prepare an inorganic powder having the following composition: quartz powder/vitreous silica powder/borosilicate glass powder=10/10/80 (wt. %). Subsequently, in a room equipped with a yellow fluorescent lamp, the above-prepared inorganic powder (50 wt. %) and a photosensitive organic vehicle of PER-800 series (product of GOO CHEMICAL CO., LTD) containing an organic binder, a photopolymerization initiator and a photocurable monomer (50 wt. %) were mixed. The resultant mixture was kneaded by use of a stirrer and a three-roll mill to thereby prepare a photosensitive insulating paste.

Subsequently, the thus-prepared photosensitive insulating pastes were successively subjected to screen printing, drying, exposure, development, washing with water, drying, and firing in the same manner as described in Example 3 to thereby form insulating layers on insulating substrates. The thus-obtained insulating layers of Test Examples 46 to 50 were assessed for the shape and taper of via holes having a diameter of 50 μm, and insulation breakdown voltage based on a film-thickness of 25 μm. The results are shown in Table 8 below.

TABLE 8

| Test Example No. | Mean particle size (μm) | Shape of via holes | Taper of via holes | Insulation breakdown voltage (kv/25 mm) |
|---|---|---|---|---|
| 46 | 7.3 | CC | Large | 2.26 |
| 47 | 5.5 | CC | Large | 3.29 |
| 48 | 4.8 | BB | Small | 5.18 |
| 49 | 0.1 | BB | Very small | 5.54 |
| 50 | 0.05 | CC | Large | 6.32 |

As is apparent from Table 8, as in the cases of Test Examples 46 and 47, when the mean particle size of the borosilicate glass powder, the quartz powder, or the vitreous silica powder is in excess of 5.0 μm, insulation breakdown voltage tends to become low. Meanwhile, as in the case of Test Example 50, when the mean particle size of the inorganic powder is less than 0.1 μm, via holes having high roundness and low taper tend to be difficult to form. Active rays are excessively absorbed in the inorganic powder particles and therefore insufficient amounts of rays are applied to the surface of the substrate, and thus photopolymerization is suppressed. In addition, density of the insulating layer may decrease and the film may be peeled off during development.

In contrast, as in the cases of Test Examples 48 and 49, when the mean particle size of the borosilicate glass powder, the quartz powder or the vitreous silica powder falls within a range of about 0.1–5.0 μm, high insulation breakdown voltage can be obtained and via holes having high roundness and low taper can be formed.

As is described above, the mean particle size of the borosilicate glass powder, the quartz powder, or the vitreous silica powder preferably falls within a range of about 0.1–5.0 μm.

Example 6

$SiO_2$, $B_2O_3$, and $K_2O$ were procured as starting materials for preparing a borosilicate glass powder contained in a photosensitive insulating paste and were mixed in appropriate amounts so as to attain the following composition: $SiO_2/B_2O_3/K_2O$=79/19/2 (wt. %). The resultant mixture was melted at 1700° C. so as to obtain molten glass. The molten glass was quenched by use of a quenching roller and ground to thereby obtain borosilicate glass powders having a mean particle size of 2.8 μm. Meanwhile, a quartz powder and a vitreous silica powder were ground in a pot to thereby obtain quartz powders and vitreous silica powders having a mean particle size of 2.8 μm. In addition, the thus-obtained borosilicate glass powders, quartz powders and vitreous silica powders were sprayed in a high-temperature atmosphere to thereby form the borosilicate glass powders, the quartz powders, and the vitreous silica powders having a shape-smoothness index of 2.0.

One of the quartz powders, one of the vitreous silica powders and one of the borosilicate glass powders were mixed to prepare an inorganic powder having the following composition: quartz powder/vitreous silica powder/borosilicate glass powder=10/10/80 (wt. %). Subsequently, in a room equipped with a yellow fluorescent lamp, the above-prepared inorganic powder (50 wt. %) and a photosensitive organic vehicle of PER-800 series (product of GOO CHEMICAL CO., LTD) containing an organic binder, a photopolymerization initiator and a photocurable monomer (50 wt. %) were mixed. In the organic vehicle, the compositional ratio of acrylic component to modified cellulose was 2/1 to 12/1. The resultant mixture was kneaded by use of a stirrer and a three-roll mill to thereby prepare photosensitive insulating pastes shown in Table 9 below.

Subsequently, each of the thus-prepared photosensitive insulating pastes was successively subjected to screen printing, drying, exposure, development, washing with water, drying, and firing in the same manner as described in Example 3 to thereby form insulating layers on insulating substrates. The thus-obtained insulating layers of Test Examples 51 to 55 were assessed for the shape and deformation of via holes having a diameter of 50 μm and film strength of the dried film. The results are shown in Table 9 below.

The film strength of the dried film was assessed in terms of ratings AA, BB and CC in sequence from good to poor on the basis of the results of a cross-cut tape peeling test.

TABLE 9

| Test Example No. | Compositional ratio | Shape of via holes | Deformation of via holes | Strength of dried film |
|---|---|---|---|---|
| 51 | 2/1 | DD | Large | AA |
| 52 | 3/1 | BB | Small | AA |
| 53 | 4/1 | BB | Small | AA |
| 54 | 10/1 | AA | Very small | BB |
| 55 | 12/1 | AA | Very small | CC |

In the Table, the term "Compositional ratio" refers to the compositional ratio of "acrylic component to modified cellulose."

As is apparent from Table 9, as in the case of Test Example 51, when the compositional ratio of modified cellulose is higher than the ratio of (acrylic component)/(modified cellulose)=3/1 in the organic vehicle, via holes tend to have poor shape and a high degree of deformation. This tendency may be attributed to absorption of active rays by modified cellulose. Meanwhile, as in the case of Test Example 55, when the compositional ratio of an acrylic component is higher than the ratio of acryl/modified cellulose 10/1, the dried film has poor adhesion to the insulating substrate, and film-strength tends to become low.

In contrast, as in the cases of Test Examples 52, 53 and 54, when the compositional ratio of acryl/modified cellulose falls within a range of about 3/1–10/1, via holes have good shape and low degree of deformation. In addition, the dried film having high film-strength can be formed.

As is apparent from the above results, an organic binder containing an acrylic copolymer having a carboxyl group and an ethylenic unsaturated group in side chains is preferably used as an organic binder in the photosensitive insulating paste, such that unexposed regions are dissolved and removed by use of a developer formed of a weak alkali aqueous solution. In addition, the compositional ratio of acryl/modified cellulose in the copolymer preferably falls within a range of about 3/1–10/1 in order to enhance adhesion between the insulating layer and the substrate.

Example 7

Table 10 shows change in viscosity (in Pa·s) of the photosensitive insulating paste of Test Example 53 shown in Table 9 with respect to time. In this case, the viscosity was measured at 1, 10 and 50 rpm by use of a Brookfield rotary viscometer, and the rotation speed was adjusted before each measurement.

TABLE 10

| Elapsed time (Days) | Rotation speed | | |
|---|---|---|---|
| | 1 rpm | 10 rpm | 50 rpm |
| 1 | 52.2 | 25.8 | 21.0 |
| 3 | 51.0 | 25.9 | 19.9 |
| 7 | 52.1 | 25.5 | 22.2 |
| 30 | 51.0 | 26.1 | 21.5 |
| 50 | 52.1 | 26.2 | 21.7 |

As is apparent from Table 10, the viscosity of the photosensitive insulating paste of Test Example 53 is very stable even after 50 days had elapsed. The photosensitive insulating paste from Test Example 53 contains a large amount of $SiO_2$, which has low reactivity with an organic binder, and another component which has low reactivity with the organic binder. Therefore, the viscosity of the paste hardly changes with passage of time, the film can be formed consistently and micro-via holes can be formed through photolithography.

Example 8

The borosilicate glass powder represented by Glass No. 8 used in Example 1, a quartz powder, a high-silica glass and a low-melting glass ($Bi_2O_3/B_2O_3/SiO_2/Al_2O_3=74/21/3/2$ (wt. %)) were blended in appropriate amounts so as to attain respective compositions shown in Table 11, and appropriate amounts of an organic binder and alcohol were added thereto. The resultant mixture was wet-mixed by use of a zirconia ball mill or a like apparatus for 3–4 hours, and then dried to an appropriate degree so as to obtain an inorganic powder. The obtained inorganic powder was used as the insulating material. Subsequently, the inorganic powder for preparing an insulating material was press-formed into a ceramic compact of 5 mmφ. The thus-prepared ceramic compacts were heated at a temperature elevation rate of 200° C./hr and fired at 850° C. as shown in Table 11 for 30 minutes to thereby obtain sintered ceramic products formed of insulating materials s–w.

TABLE 11

| Insulating material | Borosilicate glass powder | | Quartz powder (wt. %) | High-silica glass powder (wt. %) | Low-melting glass powder (wt. %) | Firing temperature (° C.) |
|---|---|---|---|---|---|---|
| | Glass No. | (wt. %) | | | | |
| s | 8 | 65 | 16.5 | 18 | 0.5 | 850 |
| t | 8 | 65 | 16 | 18 | 1.0 | 850 |

TABLE 11-continued

| Insulating material | Borosilicate glass powder | | Quartz powder (wt. %) | High-silica glass powder (wt. %) | Low-melting glass powder (wt. %) | Firing temperature (° C.) |
|---|---|---|---|---|---|---|
| | Glass No. | (wt. %) | | | | |
| u | 8 | 65 | 15 | 18 | 2.0 | 850 |
| v | 8 | 42.4 | 16 | 11.6 | 30 | 850 |
| w | 8 | 38.5 | 16 | 10.5 | 35 | 850 |

The sintered ceramic products formed of one of insulating materials s–w were evaluated for thermal expansion coefficient. By use of a dilatometer, the thermal expansion coefficient was measured up to 500° C. with respect to a reference temperature of 30° C. The results are shown in Table 12.

TABLE 12

| Insulating material | Thermal expansion coefficient |
|---|---|
| s | 5.5 |
| t | 6.0 |
| u | 6.0 |
| v | 5.8 |
| w | 5.7 |

As is apparent from Table 12, since the sintered ceramic products each formed of one of insulating materials s, t, u, v and w contain the quartz powder and the high-silica glass, the resultant ceramic sintered products are stable and have a low thermal expansion coefficient of 6.0 or less. In addition, the sintered products contain the low-melting glass and thus sintering can be carried out at a temperature of as low as 850° C. and within a time as short as 30 minutes.

Subsequently, the respective inorganic powders represented by insulating materials s–w (60 parts by weight) and a photosensitive organic vehicle (PER-800 series, product of GOO CHEMICAL CO., LTD) (40 parts by weight) were mixed, followed by kneading to thereby obtain photosensitive insulating pastes. Thick-film multi-layer circuit substrates were produced by use of the pastes under the same conditions as shown in Example 2. The thus-thick-film multi-layer circuit substrates were subjected to measurement of relative dielectric constant ($\epsilon r$), insulating reliability insulation resistance logIR) and degree of camber. The results are shown in Table 13.

TABLE 13

| Test Example No. | Insulating material | $\epsilon r$ | Insulation resistance log IR | Degree of camber (μm) | | | Firing temperature (° C.) |
|---|---|---|---|---|---|---|---|
| | | | | A | B | C | |
| 56 | s | 4.2 | >9 | 50 | 400 | 450 | 850 |
| 57 | t | 3.9 | >11 | −50 | 50 | 300 | 850 |
| 58 | u | 4.1 | >11 | 0 | 50 | 300 | 850 |
| 59 | v | 4.0 | >11 | −50 | 50 | 300 | 850 |
| 60 | w | 4.2 | <9 | 100 | 100 | 500 | 850 |

As is apparent from Table 13, as in the case of Test No. 56, when the insulating material contains the low-melting glass powder in an amount of less than 1 wt %, the sintered product is difficult to form to have a high density and insulation resistance becomes low. Meanwhile, when the insulating material contains the glass powder in an amount of in excess of 30 wt. %, dispersion of Ag serving as a electrode material may occur, and insulation resistance tends to decrease.

In contrast, in the cases of Test Example Nos. 57 to 59, the insulating material contains the low-melting glass powder in an amount of 1–30 wt. %, and thus the insulating layer can be formed to have a low relative dielectric constant and high insulating reliability even when the firing temperature is as low as 850° C. In addition, the thick-film multi-layer circuit substrate can be formed to have a low degree of camber and good shape.

The respective inorganic powders represented by insulating material s–w (50 wt. %) and a photosensitive organic vehicle of PER-800 series (product of GOO CHEMICAL CO., LTD) containing an organic binder, a photopolymerization initiator and a photocurable monomer (50 wt. %) were mixed. The resultant mixture was kneaded by use of a stirrer and a three-roll mill, to thereby prepare photosensitive insulating pastes.

Subsequently, each of the thus-prepared photosensitive insulating pastes was successively subjected to screen printing, drying, exposure, development, washing with water, drying, and firing in the same manner as described in Example 3, to thereby from insulating layers on insulating substrates. The thus-obtained insulating layers of Test Examples 61 to 65 were assessed for the shape and taper of via holes having a diameter of 50 μm, as well as insulation breakdown voltage based on a film-thickness of 25 μm. The results are shown in Table 14 below.

TABLE 14

| Test Example No. | Insulating material | Shape of via holes | Taper of via holes | Insulation breakdown voltage (kv/25 mm) |
|---|---|---|---|---|
| 61 | s | CC | Small | 0.2 |
| 62 | t | AA | Small | 4.52 |
| 63 | u | AA | Small | 5.18 |
| 64 | v | BB | Small | 5.54 |
| 65 | w | DD | Large | 1.2 |

As is apparent from Table 14, as in the case of Test Example No. 61, when the insulating material contains the low-melting glass powder in an amount of less than 1 wt. %, insulation breakdown voltage tends to decrease. Meanwhile, as in the case of Test Example No. 65, when the insulating material contains the low-melting glass powder in an amount in excess of 30 wt. %, viscous fluidity of low-melting glass components may occur, and thus the shape of via holes may deteriorate.

In contrast, as in the cases of Test Example Nos. 62 to 64, when the insulating materials contain the low-melting glass powder in an amount of 1–30 wt. %, the thick-film multi-layer circuit substrates contain via holes having good shape and small taper, and exhibit excellent characteristics; i.e., high insulation breakdown voltage.

In the photosensitive insulating paste according to the present invention, the insulating material contains borosilicate glass powder having a compositional ratio falling within the predetermined region shown in FIG. 1. Accordingly, the photosensitive insulating paste contains a relatively large amount of $SiO_2$, which has low reactivity with an organic binder. Therefore, the viscosity of the paste hardly changes with passage of time and a film can be formed in a consistent manner. In addition, micro-via holes of good shape can be formed with ease by means of photolithography. Moreover, in accordance with the type of the substrate and the circuit pattern, the thermal expansion coefficient can be freely set, by suitably selecting the compositional ratio of the borosilicate glass.

The thick-film multi-layer circuit substrate of the present invention contains insulating layers formed of the photosensitive insulating paste of the present invention. Therefore, for example, micro-via holes having good shape can be formed by means of photolithography, and density of via holes and circuit patterns can be increased. In addition, the thermal expansion coefficient of the insulating layer can be suitably set in accordance with the type of the insulating substrate and the circuit pattern, and thus, a thick-film multi-layer circuit substrate having high reliability with suppressed camber can be obtained.

What is claimed is:

1. A photosensitive insulating paste comprising an insulating material dispersed in a photosensitive organic vehicle, wherein the insulating material comprises a borosilicate glass powder containing $SiO_2$, $B_2O_3$, and $K_2O$ with the compositional proportions by weight of the three components represented by ($SiO_2$, $B_2O_3$, $K_2O$) falling within the region formed by connecting points A (65, 35, 0), B (65, 25, 10), C (85, 5, 10) and D (85, 15, 0) in a ternary diagram and at least one species selected from the group consisting of quartz powder, vitreous silica powder, and high-silica glass powder.

2. A photosensitive insulating paste according to claim 1, wherein the compositional proportions by weight of the borosilicate glass powder ($SiO_2$, $B_2O_3$, $K_2O$) fall within a region formed by connecting points E (75, 25, 0), F (75, 20, 5), G (85, 10, 5) and D (85, 15, 0) in the ternary diagram.

3. A photosensitive insulating paste according to claim 2, wherein the insulating material contains the borosilicate glass powder in an amount of about 60 wt. % or more.

4. A photosensitive insulating paste according to claim 3, wherein the borosilicate glass powder has a mean particle size of 0.1–5 μm.

5. A photosensitive insulating paste according to claim 4, wherein when the ratio of surface area to weight is represented by SS ($m^2/g$), the ratio of surface area to volume is represented by CS ($m^2/cc$), and specific gravity is represented by ρ, the borosilicate glass powder has a shape-smoothness index (ρ×SS/CS) of about 1.0–3.0.

6. A photosensitive insulating paste according to claim 5, wherein the insulating material contains a low-melting glass powder.

7. A photosensitive insulating paste according to claim 6, wherein the low-melting glass powder is a $Bi_2O_3$—$B_2O_3$—$SiO_2$ glass powder.

8. A photosensitive insulating paste according to claim 5, wherein the photosensitive organic vehicle contains an organic binder, a photopolymerization initiator and a photocurable monomer, and the organic binder is an acrylic copolymer having a carboxyl group and an ethylenic unsaturated group in side chains of the copolymer.

9. A photosensitive insulating paste according to claim 8, wherein the acrylic copolymer is an acrylic/modified-cellulosic copolymer.

10. A photosensitive insulating paste according to claim 9, wherein the compositional ratio of the acrylic/modified-cellulosic copolymer is about 3/1–10/1.

11. A photosensitive insulating paste according to claim 10, wherein the insulating material contains the borosilicate glass powder in an amount of about 60 to 80 wt. %, the borosilicate glass powder has a shape-smoothness index (ρ×SS/CS) of about 1.0–2.0.

12. A photosensitive insulating paste according to claim 1, wherein the insulating material contains the borosilicate glass powder in an amount of about 60 wt. % or more.

13. A photosensitive insulating paste according to claim 1, wherein the borosilicate glass powder has a mean particle size of 0.1–5 μm.

14. A photosensitive insulating paste according to claim 1, wherein when the ratio of surface area to weight is represented by SS (m$^2$/g), the ratio of surface area to volume is represented by CS (m$^2$/cc), and specific gravity is represented by ρ, the borosilicate glass powder has a shape-smoothness index (ρ×SS/CS) of about 1.0–3.0.

15. A photosensitive insulating paste according to claim 1, wherein the photosensitive organic vehicle contains an organic binder, a photopolymerization initiator and a photocurable monomer, and the organic binder is an acrylic copolymer having a carboxyl group and an ethylenic unsaturated group in side chains of the copolymer.

16. A photosensitive insulating paste comprising an insulating material dispersed in a photosensitive organic vehicle, wherein the insulating material comprises a borosilicate glass powder containing $SiO_2$, $B_2O_3$, and $K_2O$ with the compositional proportions by weight of the three components represented by ($SiO_2$, $B_2O_3$, $K_2O$) falling within the region formed by connecting points A (65, 35, 0), B (65, 25, 10), C (85, 5, 10) and D (85, 15, 0) in a ternary diagram and a low-melting glass powder.

17. A thick-film multi-layer circuit substrate comprising an insulating substrate having at least one insulating layer and at least one conductive layer thereon, wherein the insulating layer is a photocured insulating paste of claim 1.

18. A thick-film multi-layer circuit substrate according to claim 17, wherein the insulating layer is between a first conductive layer and a second conductive layer, each of which conductive layers comprise an Ag conductive material, a Cu conductive material or an Au conductive material, and wherein the insulating layer contains a via hole electrically connecting the first conductive layer with the second conductive layer.

* * * * *